(12) United States Patent
Nguyen et al.

(10) Patent No.: US 12,021,004 B2
(45) Date of Patent: Jun. 25, 2024

(54) EMBEDDED LID FOR LOW COST AND IMPROVED THERMAL PERFORMANCE

(71) Applicant: TEXAS INSTRUMENTS INCORPORATED, Dallas, TX (US)

(72) Inventors: Hiep Xuan Nguyen, Cedar Hill, TX (US); Jaimal Mallory Wiliamson, McKinney, TX (US); Arvin Nono Verdeflor, Allen, TX (US); Snehamay Sinha, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 17/510,684

(22) Filed: Oct. 26, 2021

(65) Prior Publication Data
US 2022/0319950 A1  Oct. 6, 2022

Related U.S. Application Data

(60) Provisional application No. 63/170,894, filed on Apr. 5, 2021.

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4817* (2013.01); *H01L 21/565* (2013.01);
(Continued)

(58) Field of Classification Search
CPC ............. H01L 23/3675; H01L 21/4817; H01L 21/565; H01L 23/49816; H01L 23/49822; H01L 24/16; H01L 2224/16237; H01L 2924/1616; H01L 2924/16251; H01L 2924/16724; H01L 21/561; H01L 23/3107;
(Continued)

(56) References Cited

U.S. PATENT DOCUMENTS

| 2012/0241941 A1* | 9/2012 | Kim | H01L 23/367 |
| | | | 438/122 |
| 2014/0077352 A1* | 3/2014 | Leal | H01L 23/3675 |
| | | | 257/E23.08 |
| 2017/0294361 A1* | 10/2017 | Tsai | H01L 23/053 |

OTHER PUBLICATIONS

"Flip Chip Ball Grid Array Package Reference Guide", Texas Instruments, Literature No. SPRU811A, May 2005.

* cited by examiner

*Primary Examiner* — Patricia D Valenzuela
(74) *Attorney, Agent, or Firm* — Dawn Jos; Frank D. Cimino

(57) ABSTRACT

An electronic device includes a multilevel package substrate, a die, a lid, and a package structure that encloses the die, a portion of the lid, and a portion of the multilevel package substrate, where the package structure fills a gap between a side of another portion of the lid and a side of the die. A method includes attaching a die to a multilevel package substrate with a first side of the die facing the multilevel package substrate and a second side facing away from the multilevel package substrate; positioning a lid on the multilevel package substrate with a first portion of the lid spaced apart from the second side of the die; and forming a package structure that encloses the die and a portion of the multilevel package substrate and fills a gap between the first portion of the lid and the second side of the die.

16 Claims, 7 Drawing Sheets

(51) Int. Cl.
*H01L 21/56* (2006.01)
*H01L 23/00* (2006.01)
*H01L 23/498* (2006.01)

(52) U.S. Cl.
CPC ...... *H01L 23/367* (2013.01); *H01L 23/49816* (2013.01); *H01L 23/49822* (2013.01); *H01L 24/16* (2013.01); *H01L 2224/16237* (2013.01); *H01L 2224/32245* (2013.01); *H01L 2924/1616* (2013.01); *H01L 2924/16251* (2013.01); *H01L 2924/16724* (2013.01)

(58) Field of Classification Search
CPC ........... H01L 23/49894; H01L 23/4334; H01L 2224/32245; H01L 23/367
See application file for complete search history.

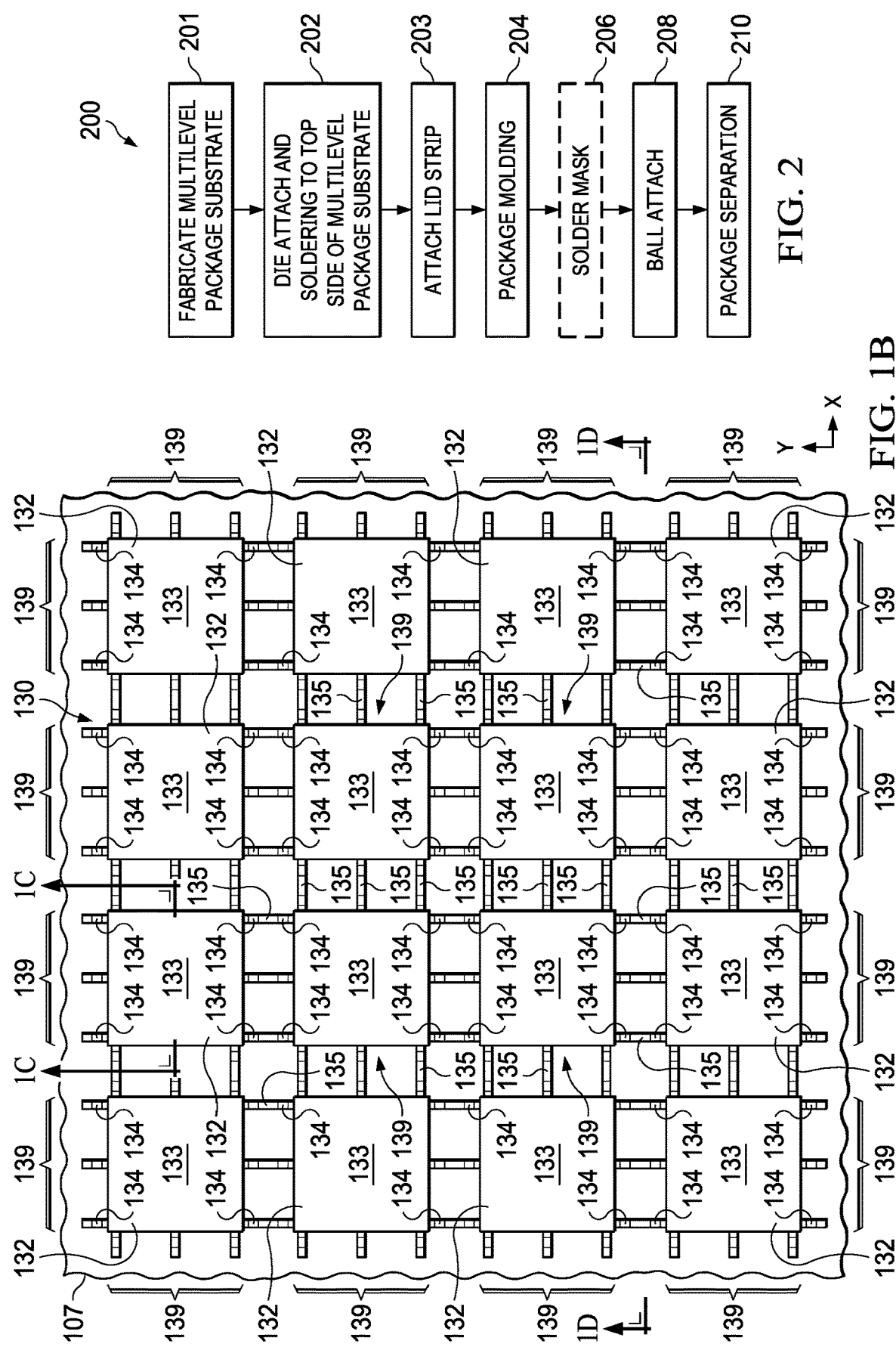

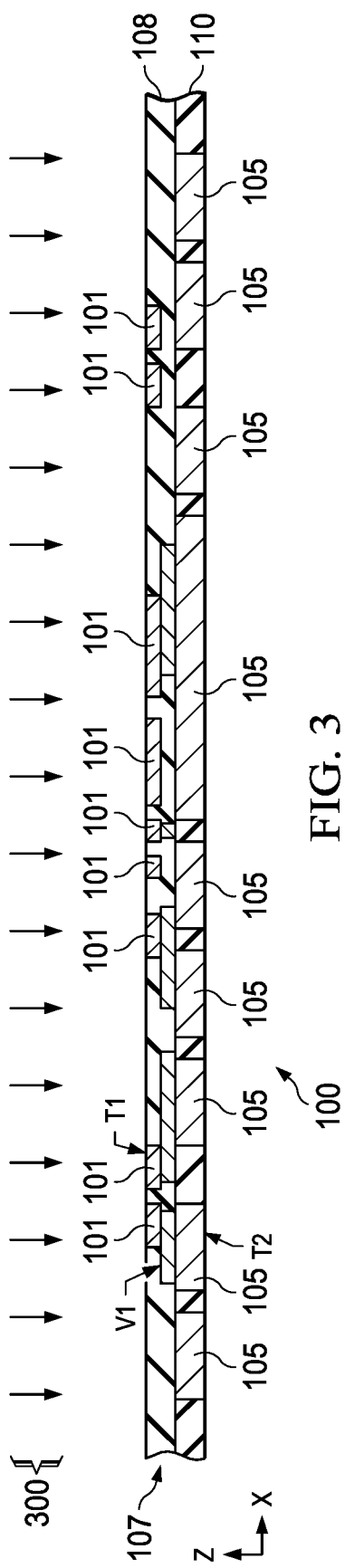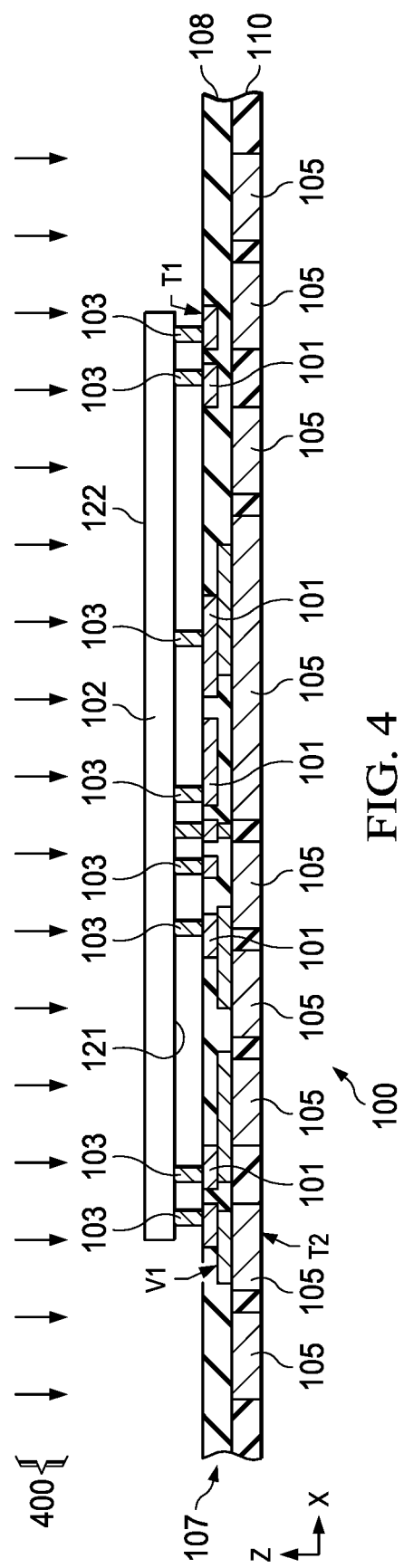

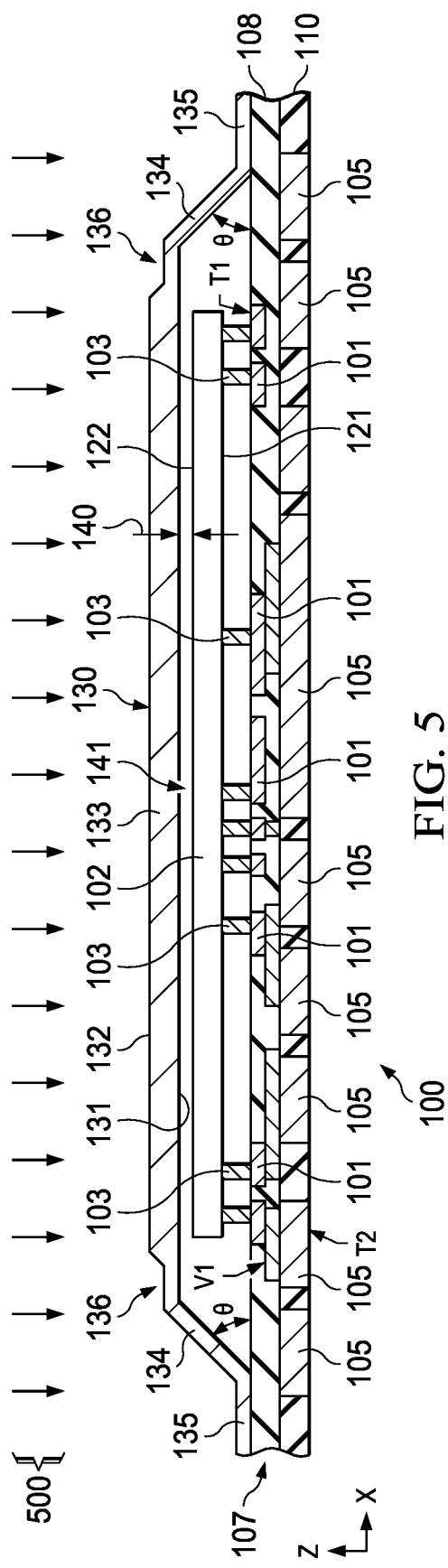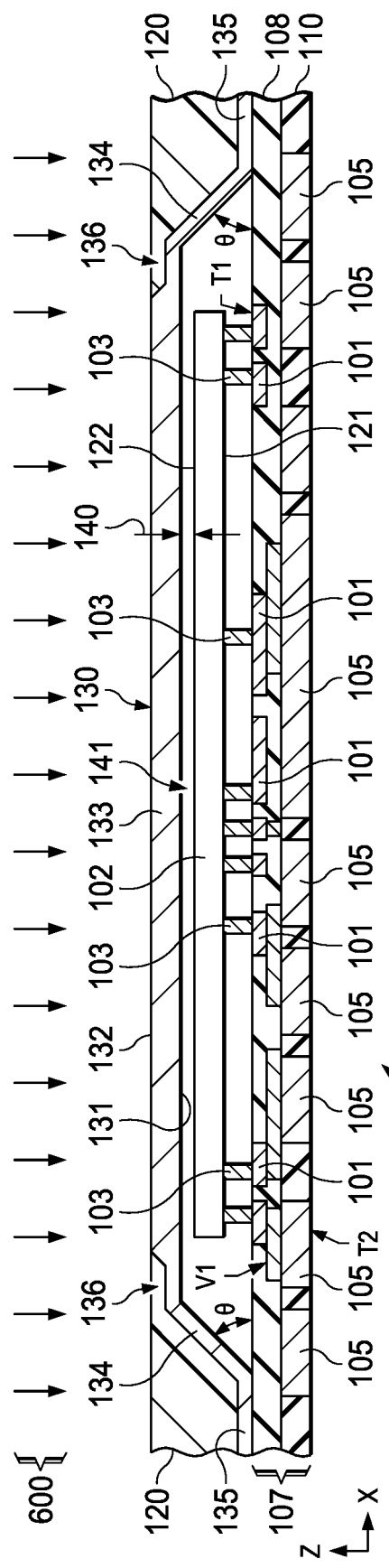

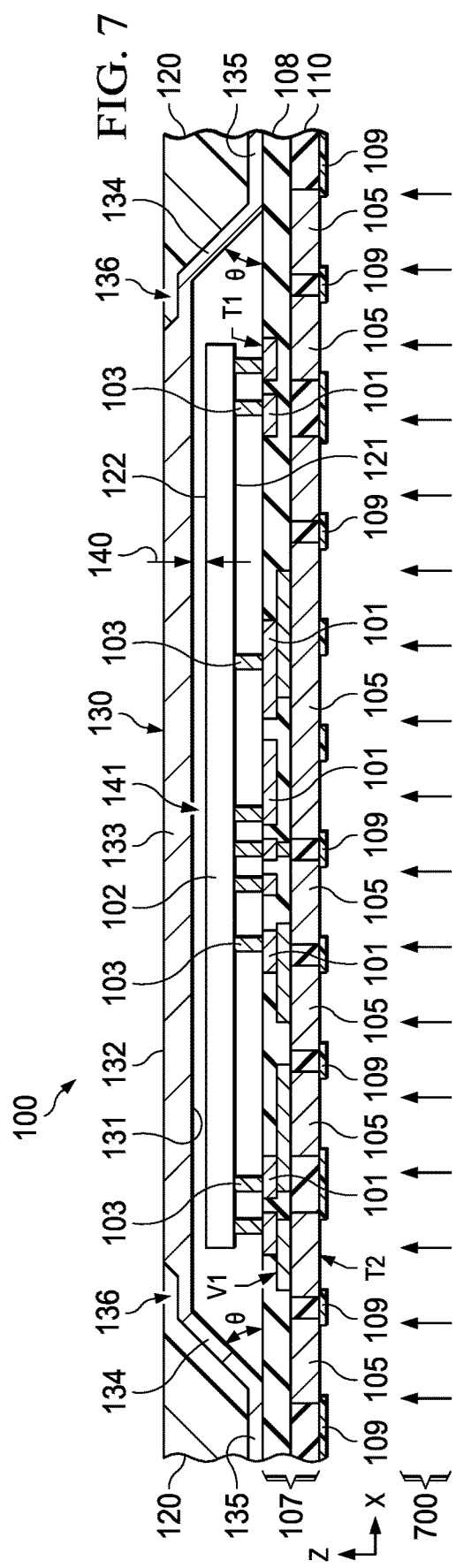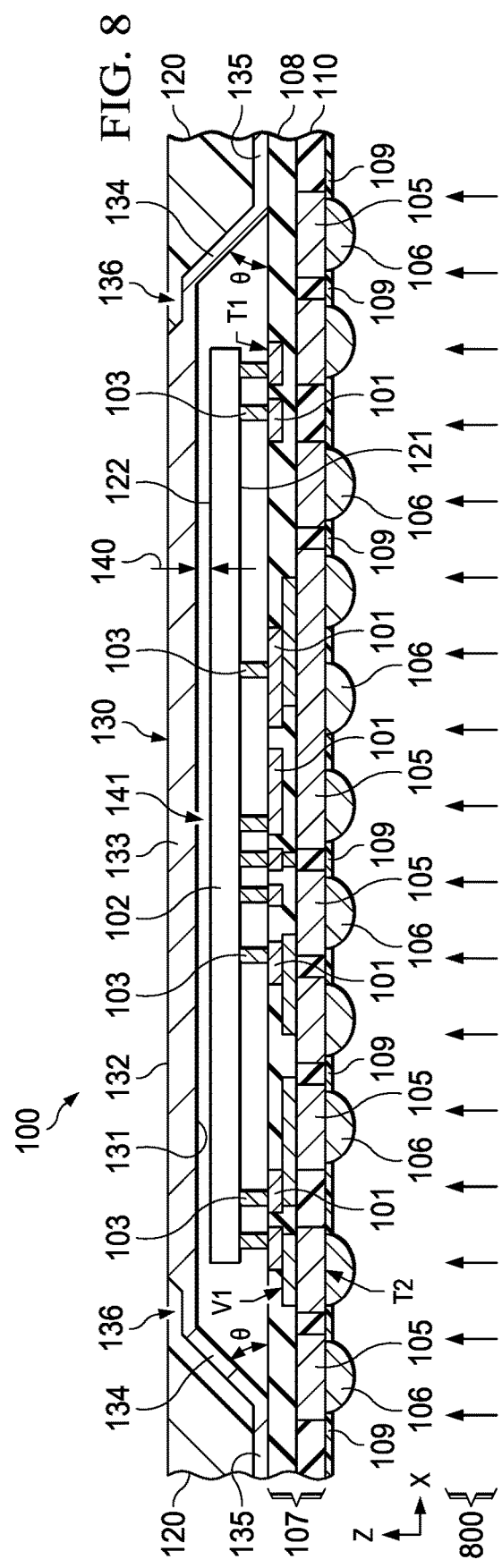

EMBEDDED LID FOR LOW COST AND IMPROVED THERMAL PERFORMANCE

CROSS-REFERENCE TO RELATED APPLICATION

This application claims priority to and benefit of U.S. Provisional Patent Application Ser. No. 63/170,894, filed on Apr. 5, 2021, and titled "PRECISION ENGINEERED EMBEDDED LID FOR LOW COST AND IMPROVED THERMAL PERFORMANCE SUPPORTING FC-CSP APPLICATIONS", the contents of which are hereby fully incorporated by reference.

BACKGROUND

Thermal performance is important for packaged electronic devices. Flip-chip chip scale package (FC-CSP) devices can include a copper lid attached on the backside of a flip-chip (FC) die using an adhesive thermal interface material (TIM) to improve thermal performance during operation. Peripheral adhesive, which can be different than the die adhesive, can be used between a package substrate and a portion of the lid to improve mechanical integrity. However, the copper lid and the attachment processing using a TIM increase cost.

SUMMARY

In one aspect, an electronic device includes a multilevel package substrate, a die, a lid, and a package structure that encloses the die, a portion of the lid, and a portion of the multilevel package substrate, where the package structure fills a gap between a side of another portion of the lid and a side of the die.

In another aspect, a lid includes lid units forming a continuous conductive structure arranged in an array of rows along a first direction and columns along an orthogonal second direction. The respective lid units include first, second, and third portions, the first portion extending in a first plane of the first and second directions and having opposite first and second sides, the second portion extending between the first portion and the third portion at an acute angle to the first plane and away from the second side of the first portion, and the third portion extending in a second plane of the first and second directions, where the third portions of adjacent lid units are connected to one another.

In another aspect, a method includes attaching a die to a multilevel package substrate with a first side of the die facing the multilevel package substrate and a second side facing away from the multilevel package substrate; positioning a lid on the multilevel package substrate with a first portion of the lid spaced apart from the second side of the die; and forming a package structure that encloses the die and a portion of the multilevel package substrate and fills a gap between the first portion of the lid and the second side of the die.

BRIEF DESCRIPTION OF THE DRAWINGS

FIG. 1B is a top plan view of a lid panel or strip with an array of lid units in rows and columns positioned on a multilevel package substrate array.

FIG. 2 is a flow diagram of a method for fabricating an electronic device.

FIGS. 3-9 are a partial sectional side elevation views of a packaged electronic device during fabrication.

DETAILED DESCRIPTION

Figure 1:
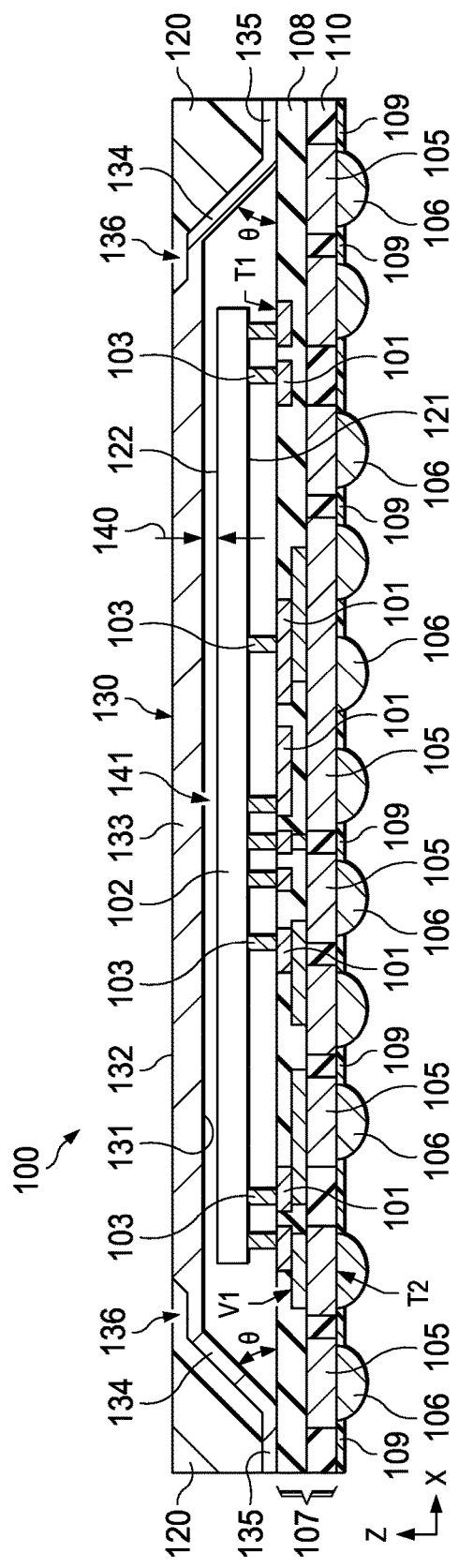
FIG. 1 is a sectional side elevation view of a packaged electronic device with a lid and molded material between a side of the lid and a semiconductor die taken along line 1-1 of FIG. 1A.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1C:
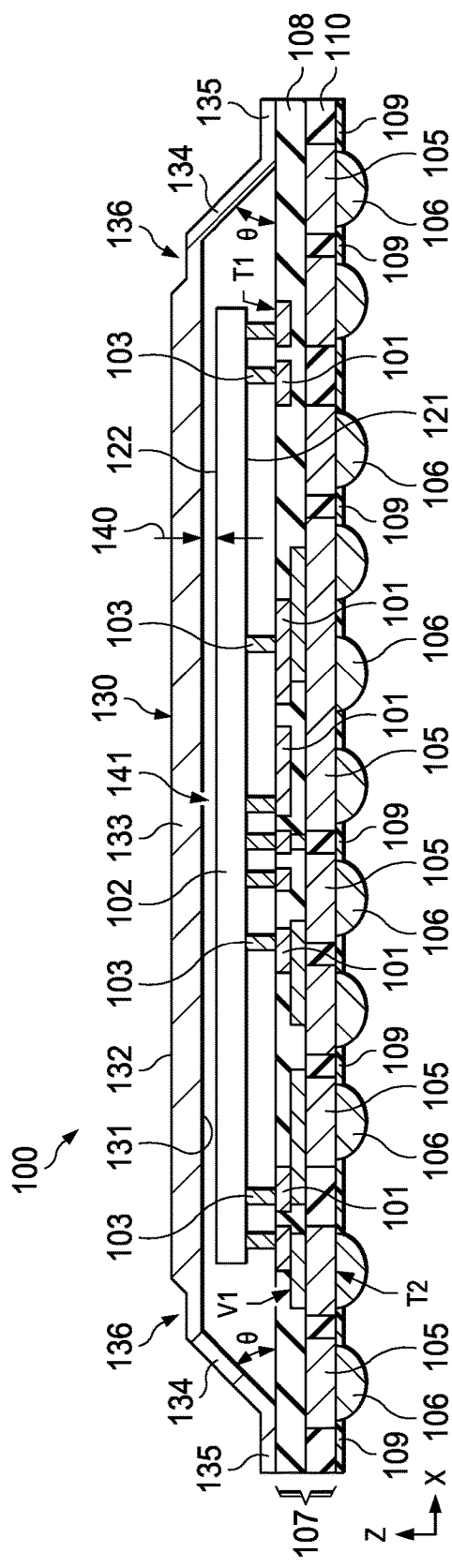
FIG. 1C is a partial sectional side elevation view of a packaged electronic device during fabrication taken along line 1C-1C of FIG. 1B.
Figure 1A:
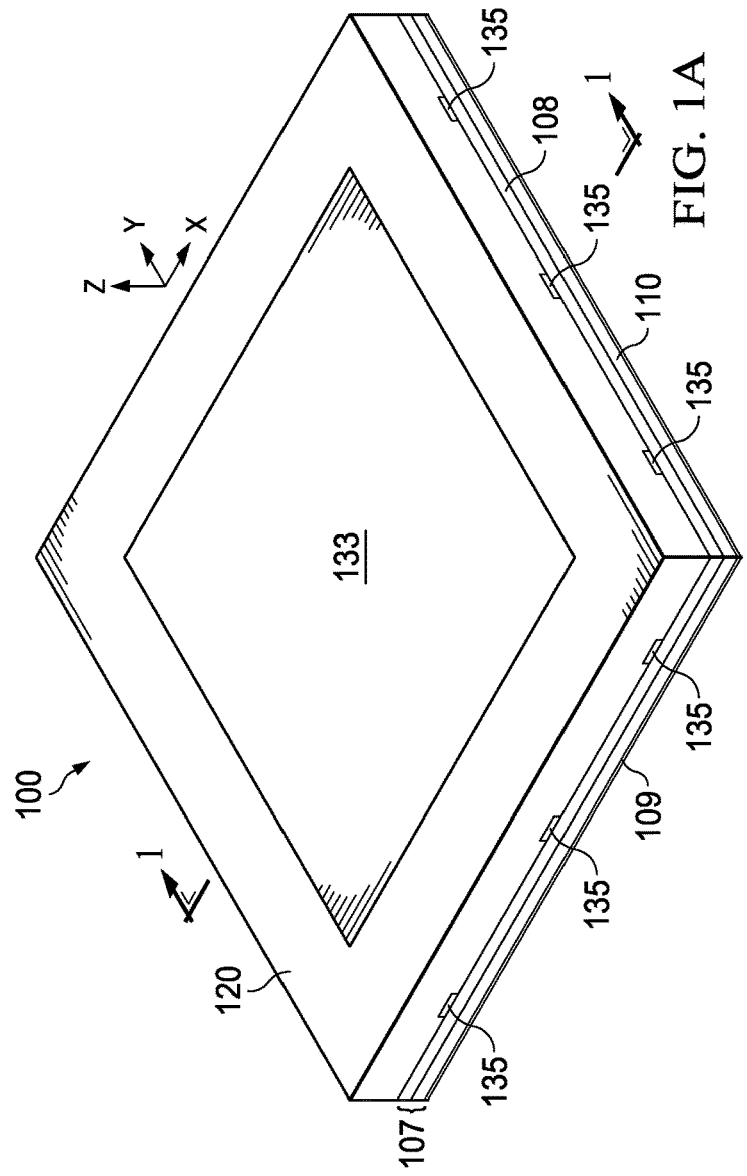
FIG. 1A is a perspective view of the packaged electronic device of FIG. 1.
Figure 1D:
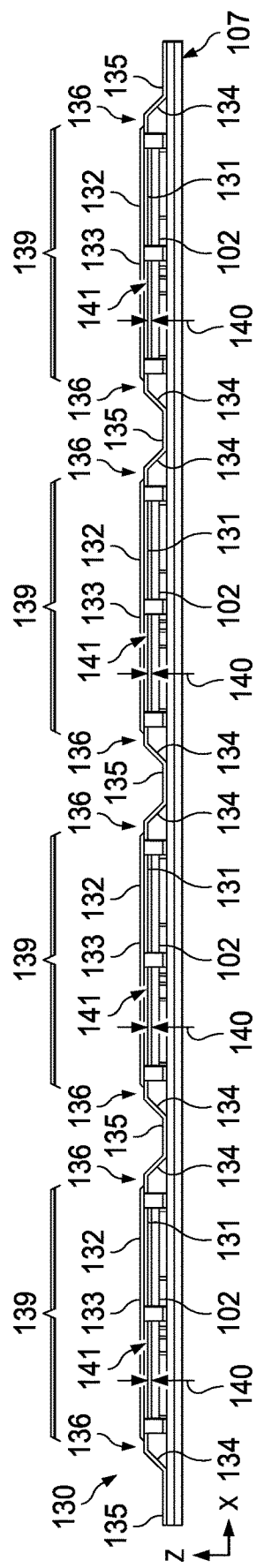
FIG. 1D is a sectional side elevation view of a lid panel or strip with the array of lid units in rows and columns positioned on a multilevel package substrate array.

Referring initially to FIGS. 1-1D, FIG. 1 shows a packaged electronic device 100 with a lid 130 and a package structure 120 with molded material between a side of the lid 130 and a semiconductor die 102. FIG. 1A is a perspective view of the packaged electronic device 100 and the sectional view of FIG. 1 is taken along line 1-1 of FIG. 1A. FIG. 1B is a top view of a lid panel or strip 130 with an array of lid units 139 in rows and columns positioned on a multilevel package substrate array 107. FIG. 1C is a sectional side view of the packaged electronic device 100 during fabrication taken along line 1C-1C of FIG. 1B, and FIG. 1D is a sectional side view of the lid panel 130 with the array of lid units 130 in a row positioned on the multilevel package substrate array 107. As shown in FIG. 1, the packaged electronic device 100 includes the die 102 that is electrically coupled to conductive landing areas 101 of the multilevel package substrate 107. The semiconductor die 102 has one or more electronic components therein, such as transistors, resistors, capacitors, etc. The die 102 has conductive terminals 103 that are electrically coupled by solder connections to respective conductive landing areas 101 of the top or first side of the multilevel package substrate 107. The example electronic device 100 is a flip chip ball grid array (BGA) device with solder balls 106 coupled to conductive landing pads 105 of a bottom or second side of the multilevel package substrate 107.

The multilevel package substrate 107 has a first level and a second level. In other examples, more than two levels are included. The first level includes a first trace layer T1 and a first via layer V1, as well as a second level that includes a second trace layer T2. The first and second levels T1, V1 and T2 each have patterned conductive features, such as copper, aluminum, or other conductive metal. The first level T1, V1 includes compression molded dielectric features 108 and the second level T2 includes compression molded dielectric features 110. The compression molded dielectric features 108 and 110 extend between different conductive features of the respective levels and between adjacent levels. The molded dielectric features 108 and 110 in one example are or include an electrically insulating dielectric material. The thickness and dielectric material in the respective levels provide a withstanding voltage according to a desired voltage separation between circuits and components thereof for a given design.

The first level T1, V1 extends in a first plane of a first direction (e.g., labeled X in the drawings) and an orthogonal second direction (e.g., labeled Y). The first level T1, V1 includes a conductive first trace layer T1 and a conductive first via layer V1. The first level T1, V1 has a first side (e.g., the top side of the first trace layer T1) with the landing areas 101. The landing areas 101 are spaced apart from one another along the first and second directions X and Y. The second level T2 includes a conductive second trace layer T2. The second level extends in a second plane of the first and second directions X and Y. The second trace layer T2 is spaced apart from (e.g., below) the first trace layer T1 along a third direction (e.g., labeled Z) that is orthogonal to the first and second directions X and Y. The multilevel package substrate 107 includes a solder mask 109 on a portion of the second side between the conductive landing pads 105. In another example, the solder mask 109 is omitted.

The die 102 has a first side 121, a second side 122, and conductive terminals 103, the first side 121 of the die 102 faces the multilevel package substrate 107. The conductive terminals 103 of the die 102 are electrically coupled to respective ones of the conductive landing areas 101. In one example, the conductive terminals 103 are copper pillars or bumps soldered to the respective conductive landing areas 101 of the multilevel package structure 107.

The electronic device 100 also includes a package structure 120 that encloses the die 102 and a portion of the multilevel package substrate 107. In one example, the package structure 120 is or includes a molded material, such as plastic epoxy. The solder balls 106 are attached to respective ones of the landing pads 105 and allow soldering of the electronic device 100 to a host system such as a printed circuit board (PCB). In one example, the landing pads 105 have circular or elongated shapes to facilitate attachment of the solder balls 106 to the landing pads 105.

The electronic device 100 includes a conductive lid 130 to facilitate thermal performance in operation of the electronic device 100. The lid 130 has a base or first portion 133, a downwardly extending leg or second portion 134, and a foot or third portion 135. In this illustrated example, the lid 130 has multiple leg and foot portions 134, 135 extending from the first portion 133 on each of four lateral sides, as shown in FIG. 1B. As also shown in FIGS. 1B and 1C, the device 100 is fabricated as one of a number of similar devices 100 of an array panel or strip with rows and columns along the respective first and second directions X and Y, and individual packaged electronic device 100 are subsequently separated from the panel. In panel form, the third portions 135 of adjacent lid units 139 are connected to one another along both row and column directions as shown in FIGS. 1B and 1C. The first portion 133, the second portion 134, and the third portion 135 of each die area form a continuous conductive structure in the finished packaged electronic device 100 of FIGS. 1 and 1A. In panel form during fabrication (e.g., FIGS. 1B and 1C), the respective first, second, and third portions 133, 134, and 135 form a continuous conductive lid panel structure 130. In one example, the panel 130 is or includes aluminum. This example provides cost savings compared to copper lids. The lid 130 in one example is formed from a starting sheet or strip of conductive metal (e.g., aluminum) and is stamped to form a three-dimensional structure having the first, second, and third portions 133, 134, and 135 and the features as described herein. In this or another example, one or more features of the lid 130 can be formed by other techniques, such as bending, etching, etc.

The first portion 133 extends in a third plane of the first and second directions X and Y. The first portion 133 has a first side 131 and an opposite second side 132. The first side 131 of the first portion 133 is spaced apart from the second side 122 of the die 102 by a spacing distance 140 along a third direction Z that is orthogonal to the first and second directions X and Y to form a gap 141. In one example, the spacing distance 140 of the gap 141 between the first side 131 of the first portion 133 and the second side 122 of the die 102 is 30 µm or more and 100 µm or less. In one implementation, the spacing distance 140 of the gap 141 between the first side 131 of the first portion 133 and the second side 122 of the die 102 is 80 µm or less. The second portion 134 extends between the first portion 131 and the third portion 135 at an acute angle θ to the third plane and the second portion 134 extends away from the second side 132 of the first portion 133 (e.g., downward in the orientation shown in FIGS. 1, 1C, and 1D). The third portion 135 extends on the side of the first level T1, V1 of the multilevel package substrate 107 in a fourth plane of the first and second directions X and Y.

As shown in FIG. 1, the package structure 120 encloses the die 102, the second portion 134 of the lid 130, and a portion of the multilevel package substrate 107. The package structure 120 fills the gap 141 between the first side 131 of the first portion 133 and the second side 122 of the semiconductor die 102. The electronic device 100 does not require adhesive thermal interface material, which provides cost savings compared to device packaging approaches that adhere copper lids to a semiconductor die backside using adhesive thermal interface material. As shown in FIGS. 1 and 1A, the package structure 120 exposes at least a portion of the top or second side 132 of the first portion 133 of the lid 130 to promote good thermal performance in operation of the packaged electronic device. In addition, the third portions 135 of the lid 130 operate as tie bars during packaging operations and the package structure 120 exposes an end of the respective third portion 135 of the lid 130 as shown in FIGS. 1 and 1A.

The exposed portion of the second side 132 of the first portion 133 can be connected to a heat sink structure or other external thermal transfer structure (not shown) to further facilitate thermal performance. In this or another example, the thermal conduction properties of the molded package structure material is tailored or designed to further facilitate heat transfer from the second side 122 of the semiconductor die 102 to the first portion 133 of the lid 130.

In one implementation, the first portion 133 of the lid 130 has a substantially uniform thickness along the third direction Z. In the example of FIGS. 1-1D, the first portion 133 of the lid 130 has a step feature 136 between first and second segments of the second side 132 of the first portion 133. A step feature, as used herein, refers to a change in the extent, height, width and/or thickness of a side of a feature, which can be a 90 degree change or a gradual or ramped change at a different angle. In this example, the package structure 120 exposes the second side 132 of the first segment of the first portion 133 of the lid 130, and the package structure 120 encloses the second segment of the first portion 133 of the lid 130. The step feature 136 provides a mold lock feature which, in combination with the mold used to create the package structure 120, facilitates the package structure 120 enclosing the second segment of the first portion 133 to mitigate or prevent delamination of the packaged electronic device 100. In another example, the first portion of the lid 130 can include bottom-side step features as illustrated and described below in connection with FIG. 10.

As seen in the example of FIGS. 1-1D, the finished packaged electronic device 100 (FIGS. 1 and 1A) and the panel array with rows and columns of lid units 139 (FIGS. 1B-1D) have three sets of the respective second and third portions 134 and 135 on each of four sides. In this example, the ends of the third portions 135 are exposed by the package structure 120 in the finished packaged electronic device 100 (FIG. 1B). In the sectional views of FIGS. 1 and 1C, for example, the respective leg and foot portions on the left side of the drawing can be considered as second and third portions 134 and 135, and the respective leg and foot portions on the right side of the drawing can be considered as fourth and fifth segments of the lid 130. In various implementations, the lid 130 can include a single set of the second and third portions 134 and 135 or multiple sets of the second and third portions 134 and 135 (e.g., 12 sets per lid unit 139 in FIG. 1B).

Referring also to FIGS. 2-9, FIG. 2 shows a method 200 for fabricating an electronic device, and FIGS. 3-9 show sectional side views of the electronic device 100 (e.g., taken along line 1-1 of FIG. 1A) undergoing fabrication according to the method 200. At 201 in FIG. 2, the method 200 includes fabricating the multilevel package substrate 107, including fabricating the first level T1, V1 and fabricating the second level T2. In one example, the multilevel package substrate fabrication at 201 includes forming the first level (e.g., T1, V1) on a carrier structure (not shown), and forming the second level (e.g., T2) on the first level, after which the carrier structure is removed from the first level.

The formation of the first and second levels in this example, concurrently forms the first side with the landing areas 101 spaced apart from one another along the first direction X and the second side with the circular conductive landing pads 105, which are defined in the illustrated implementation by the plating masks used in electroplating operations detailed below. The individual levels in one example are formed using electroplating processes and patterned plating masks. The first level formation starts with forming the first trace layer T1 using a carrier, such as a panel or strip with multiple prospective package substrate sections (not shown) and thin copper seed layers to facilitate the electroplating process. Copper is deposited on the seed layers by electroplating in portions of the topside of the carrier structure exposed through a patterned plating mask that define the conductive landing areas 101 on the bottom side of the first trace layer T1 of the multilevel package substrate 107. The plating mask is removed, and another electroplating process is performed using a patterned second plating mask (not shown) to deposit further copper to form the first via layer V1 in the areas exposed by the second plating mask.

A compression molding process (not shown) that forms molded dielectric features 108 on exposed portions of the conductive features of the first trace layer T1 and the vias of the first via layer V1 to an initial thickness that covers the first trace layer T1 and the first via layer V1. A grinding process (not shown) is performed to grind upper portions of the molded dielectric material 108 and expose the upper portions of the first trace layer T1 and the first via layer V1. In another example, a chemical etch is used. In a further example, a chemical mechanical polishing process is used. The second level is then formed on the first level using similar processing and the finished multilevel package substrate 107 is removed from the carrier as shown in FIG. 3. In one example, the molded dielectric layers 108 and 110 of the multilevel package substrate 107 are or include MJ1 ABF RLF dielectric material.

The method 200 in FIG. 2 also includes die attach and soldering at 202 via an electrical connection process 400 in FIG. 4 that electrically couples the conductive terminals 103 of the semiconductor die 102 to respective ones of the landing areas 101 on the top side of the first trace layer T1. The illustrated electrical connection example includes flip-chip soldering. In another implementation, the die 102 is attached to a portion of the first side of the multilevel package substrate 107, followed by a wire bonding process to electrically connect the die terminals 103 to respective the landing areas 101 on the top side of the first trace layer T1. In the example of FIG. 4, solder is applied (e.g., dipped or otherwise deposited) onto the bottom sides of the conductive terminals 103 of the semiconductor die 102, and the semiconductor die 102 is placed with the respective terminals 103 on or over the respective landing areas 101 of the first trace layer T1. A thermal solder reflow process is performed that solders the die terminals 103 to the landing areas 101 as shown in FIG. 4.

At 203 in FIG. 2, the panel lid 130 is positioned on the array panel of the multilevel package substrate 107 with gaps (e.g., gaps 141 in FIGS. 1D and 5) between the bottom or first sides 131 of the first portions 133 of the respective lid units 139 of the lid 130 and the top side 122 of the respective attached semiconductor dies 102. FIG. 5 shows one example, in which an automated pick and place process 500 is performed that positions the lid 130 on the multilevel package substrate 107 with the respective first portions 133 of the lid 130 extending in the third plane of the first and second directions X and Y, with the first sides 131 of the first portions spaced apart from the second side 122 of the die 102 along the third direction Z by the spacing distance 140, and with the respective third portions 135 extending on the side of the first level T1, V1 of the multilevel package substrate 107 in the fourth plane of the first and second directions X and Y. In one example, the lid 130 is positioned relative to the multilevel package substrate 107 using a jig or fixture (not shown). In another example, one, some or all of the third portions 135 are adhered to the multilevel package substrate 107 using an adhesive (not shown). In the illustrated example, the lid 130 is positioned on the multilevel package substrate 107 with no adhesive to facilitate low manufacturing cost, and the structure of the lid 130 with the third portions 135 engaging the multilevel package substrate 107 helps keep the lid 130 in place during molding. In one implementation, the area of the lid 130 over the die 102 is engineered or designed to minimize the gap 141 between die 102 and the lid 130 (e.g., flat, convex, concave, or combinations thereof, for example, depending on the die-area warpage). Design features, such as step features of the lid 130 provide targeted curvature, for example, to serve as locking features to reduce or mitigate mold-to-lid delamination. The illustrated example provides low cost and low complexity manufacturing with the lid unit 139 assembled in strip or array form via gang processing as opposed to separately attaching individual lids one lid at a time. Moreover, illustrated example provide material cost savings be using aluminum instead of copper, as well as eliminating the material cost and processing time associated with targeted dispensing and curing thermal interface materials. Certain implementations also mitigate or avoid handling and integrity issues associated with exposed individual lids.

Important features and advantages of the example lid 130 includes use in the form of a three-dimensional strip in which each lid has feet or third portions 135 and a raised heat spreading hood or the first portion 133 that sits above the semiconductor die 102. In a given implementation, the height of the first portion 133 above the third portion 135 along the third direction Z is adjusted or designed to control the spacing distance 140 of the gap 141 the die back surface or side 122 and the lid surface 131 to facilitate the least thermal resistance and optimal mold flow. In addition, the third portions or feet 135 of the lid 130 act as tie bars to adjacent lid units 139 in the strip or panel lid 130. The lid 130 is placed on the die-mounted substrate strip 107 and the assembly is then encapsulated with the lid top surface 132 exposed, and no lid attach adhesive is used in the described example. The performance of embedded lid 130 can be further improved by the use of high thermal conductivity mold compound of the package structure 120. In another advantage, the in-situ process of lid placement and embedding the lid 130 during molding provides significant value to lower cost and maintain thermal performance comparable with lidded copper solutions. The value of eliminating the TIM in the process also mitigates any concerns of cross contamination between mold compound and silicone based TIMs and the process step in dispensing the TIM on die. The feature of modifying the gap 141 between lid 130 and the semiconductor die 102 enables concurrently improving of optimizing both thermal performance and manufacturability.

The method 200 continues at 204 in FIG. 2 with package molding. FIG. 6 shows one example, in which a molding process 600 is performed that forms a package structure 120 that encloses the die 102, the second portion 134 of the lid 130, and a portion of the multilevel package substrate 107. In one implementation, a mold (not shown) engages the top or second side 132 of the first portions 133 of the lid 130 of each lid unit 139 of the panel array, and applies downward pressure thereto (e.g., in the negative Z direction in the illustrated orientation). The lid 130 with the first, second, and third portions 133, 134, and 135 mitigates lid warpage during molding operations, and the gaps 141 allow mold material to flow into, and fill, the gaps 141. This provides thermal coupling through the material in the gaps 141 between the first portions 133 of the lid 130 and the respective semiconductor dies 102 while mitigating or avoiding the cost and process complexity associated with thermal interface materials. The package structure 120 exposes a portion of the second side 132 of the first portion 133 of the lid 130. In the illustrated example, the top side of the mold (not shown) engages the second side 132 of the first portion 133 of the lid 130 during the molding process 600 and the resulting top side of the produced devices 100 is generally planar including the exposed top side 132 of the lid 130 and the top surface of the molded package structure 120. In one implementation, the process can include removal of any remnant mold flash from the second side 132 of the first portion 133 of the lid 130 after completion of the molding process 600. The package structure 120 also fills the gap 141 between the first side 131 of the first portion 133 and the second side 122 of the die 102. In one example, the package structure 120 is or includes Carsem/TITL mold compound. In the example of FIG. 6, in which the first portion 133 of the lid 130 has the step feature 136 between first and second segments of the second side 132 of the first portion 133, the package structure 120 exposes the second side 132 of the first segment of the first portion 133 of the lid 130 and encloses the second segment of the first portion 133 of the lid 130.

In one example, the method 200 includes forming the solder mask 109 at 206 on a portion of the second side of the multilevel package substrate 107 between the conductive landing pads 105. FIG. 7 shows one example, in which a solder mask printing process 700 is performed at 206. The process 700 prints the solder mask material 109 onto select portions of the second side of the multilevel package substrate 107 between the conductive landing pads 105, as shown in FIG. 7. In another implementation, the process 700 is performed to print the solder mask material 109 partially onto edge portions of the conductive landing pads 105. In another implementation, no solder mask is formed.

At 208 in FIG. 2, a ball attach process is performed. FIG. 8 shows one example, in which a ball attach process 800 is performed that attaches the solder balls 106 to the conductive landing pads 105 on the second side of the multilevel package substrate 107.

Figure 9:
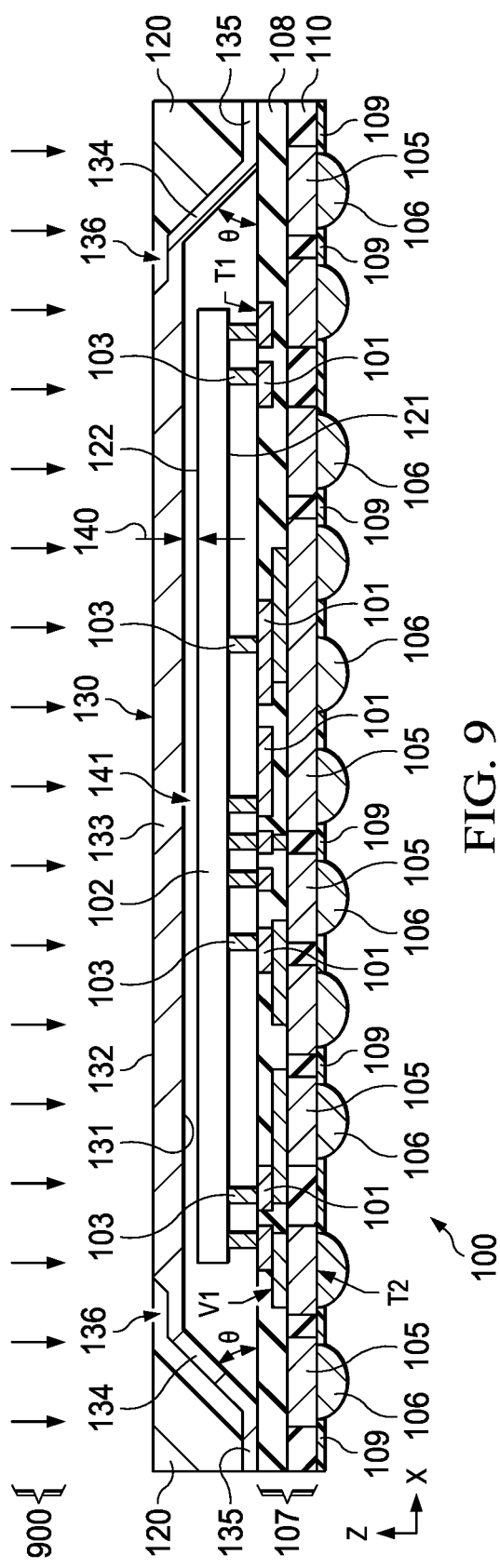

A package separation process (not shown) is then performed at 210 in FIG. 2, such as sawing, laser cutting, etc. FIG. 9 shows one example, in which a package separation process 900 is performed that separates individual packaged electronic devices 100 from a panel of concurrently processed devices, where FIGS. 1 and 1A above show the example finished electronic device 100. In another example, the ball attach process at 208 is omitted, and the exposed bottom sides of the conductive landing pads 105 can be soldered to a host PCB using solder paste, or installed in a socket of a host PCB, or connected by other suitable attachment techniques, for example, in a land grid array (LGA) application. In another implementation, solder pads (not shown) are attached to the conductive landing pads 105 on the second side of the multilevel package substrate 107 (e.g., at 208 in FIG. 2) instead of attaching solder balls, to facilitate later soldering to a host PCB or attachment to a socket (not shown) of a host PCB.

Figure 10:
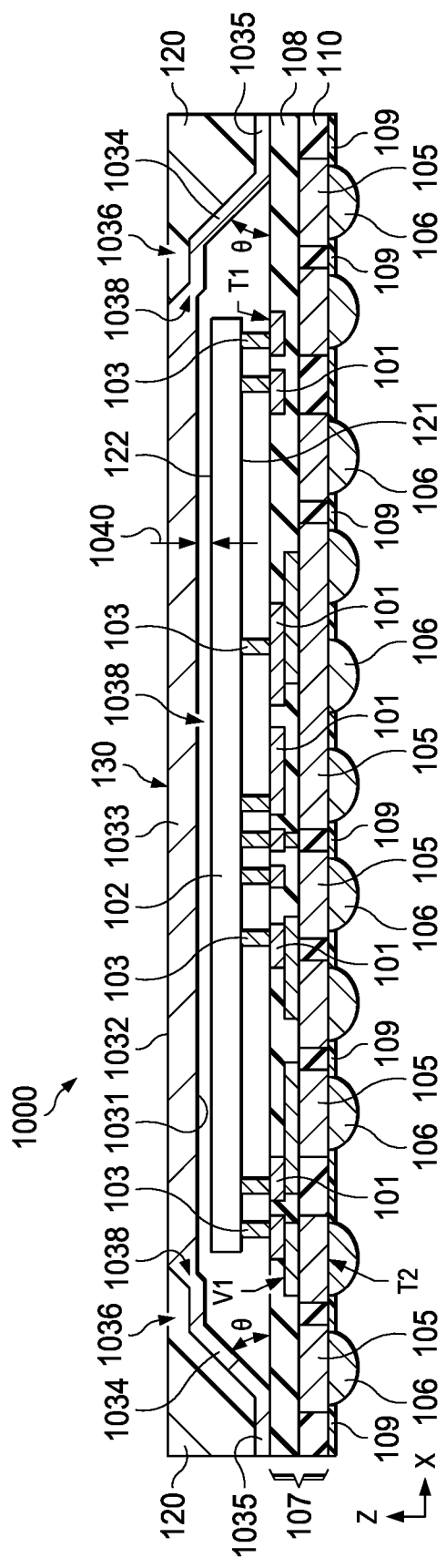
FIG. 10 is a partial sectional side elevation view of another packaged electronic device.

FIG. 10 shows a sectional side view of another packaged electronic device 1000. The packaged electronic device 1000 includes similarly numbered structures and features as described above in connection with FIGS. 1 and 1A, including the multilevel package substrate 107, the semiconductor die 102 and the molded package structure 120. The packaged electronic device 1000 can be fabricated according to the method 200 of FIG. 2, in one example.

The packaged electronic device 1000 in FIG. 10 includes a lid 1030 and the package structure 120 includes molded material between a side of the lid 1030 and the semiconductor die 102. The semiconductor die 102 has conductive terminals 103 that are electrically coupled by solder connections to respective conductive landing areas 101 of the first side of the multilevel package substrate 107. The example electronic device 1000 is a flip chip ball grid array (BGA) device with solder balls 106 coupled to conductive landing pads 105 of a bottom or second side of the multilevel package substrate 107.

The conductive lid 1030 facilitates thermal performance in operation of the electronic device 1000. The lid 1030 has a base or first portion 1033, a downwardly extending leg or second portion 1034, and a foot or third portion 1035. In this illustrated example, the lid 1030 has multiple leg and foot portions 1034, 1035 extending from the first portion 1033 on each of four lateral sides. In one example, the device 1000 is fabricated as one of a number of similar devices 1000 of an array panel or strip with rows and columns along the respective first and second directions X and Y, and individual packaged electronic device 1000 are subsequently separated from the panel. In panel form, the third portions 1035 of adjacent device areas are connected to one another along both row and column directions. The first portion 1033, the second portion 1034, and the third portion 1035 of each die area form a continuous conductive structure in the finished packaged electronic device 1000. In panel form during fabrication, the respective first, second, and third portions 1033, 1034, and 1035 form a continuous conductive lid panel structure 1030. In one example, the panel 1030 is or includes aluminum. This example provides cost savings compared to copper lids.

The first portion 1033 extends in a third plane of the first and second directions X and Y. The first portion 1033 has a first side 1031 and an opposite second side 1032. The first side 1031 of the first portion 1033 is spaced apart from the second side 122 of the die 102 by the spacing distance 140 along a third direction Z to form the gap 141. In one example, the spacing distance 140 of the gap 141 between the first side 1031 of the first portion 1033 and the second side 122 of the die 102 is 30 µm or more and 100 µm or less. In one implementation, the spacing distance 140 of the gap 141 between the first side 1031 of the first portion 1033 and the second side 122 of the die 102 is 80 µm or less. The second portion 1034 extends between the first portion 1031 and the third portion 1035 at the acute angle θ to the third plane and the second portion 1034 extends away from the second side 1032 of the first portion 1033 (e.g., downward in the orientation shown in FIG. 10). The third portion 1035 extends on the side of the first level T1, V1 of the multilevel package substrate 107 in a fourth plane of the first and second directions X and Y.

As shown in FIG. 10, the package structure 120 encloses the die 102, the second portion 1034 of the lid 1030, and a portion of the multilevel package substrate 107. The package structure 120 fills the gap 141 between the first side 1031 of the first portion 1033 and the second side 122 of the semiconductor die 102. The electronic device 1000 does not require adhesive thermal interface material, which provides cost savings compared to device packaging approaches that adhere copper lids to a semiconductor die backside using adhesive thermal interface material. The package structure 120 exposes at least a portion of the top or second side 1032 of the first portion 1033 of the lid 1030 to promote good thermal performance in operation of the packaged electronic device. In addition, the third portions 1035 of the lid 1030 operate as tie bars during packaging operations and the package structure 120 exposes an end of the respective third portion 1035 of the lid 1030.

The exposed portion of the second side 1032 of the first portion 1033 can be connected to a heat sink structure or other external thermal transfer structure (not shown) to further facilitate thermal performance. In this or another example, the thermal conduction properties of the molded package structure material is tailored or designed to further facilitate heat transfer from the second side 122 of the semiconductor die 102 to the first portion 1033 of the lid 1030.

In the example of FIG. 10, the first portion 1033 of the lid 1030 has the step feature 1036 between first and second segments of the second side 1032 of the first portion 1033. In this example, the package structure 120 exposes the second side 1032 of the first segment of the first portion 1033 of the lid 1030, and the package structure 120 encloses the second segment of the first portion 1033 of the lid 1030. The step feature 1036 provides a mold lock feature which, in combination with the mold used to create the package structure 120, facilitates the package structure 120 enclosing the second segment of the first portion 1033 to mitigate or prevent delamination of the packaged electronic device 1000. In another example, the first portion of the lid 1030 can include bottom-side step features as illustrated and described below in connection with FIG. 10.

In addition, the first portion 1033 of the lid 1030 has a second step feature 1038 between segments of the first side 1031 of the first portion 1033. This second step feature 1038 in one example extends around and slightly outward of the peripheral edges of the semiconductor die 102 to provide a concave bottom or first side 1031 of the first portion 1033 that faces the top or second side 122 of the semiconductor die. In practice, the size of the second step feature 1038 sets the spacing distance 140 of the gap 141 that is filled with the molding compound material of the package structure 120 between the first side 1031 of the first portion 1033 and the second side 122 of the die 102.

The disclosed example provide cost savings approach by eliminating the use of copper as lid material, the processing costs of individually attaching copper lids one unit at a time which impacts throughput and avoids the cost and processing time of using thermal interface materials. In addition, the described solutions mitigate or avoid deflashing and cleaning operations associated with copper lid mounting approaches. The example third or foot portions 135, 1035 and the shape of the second portions 134, 1034 and any included second step feature 1038 create the gap 141 between the semiconductor die 102 and the lid 130, 1030. In addition, the third portions 135, 1035 act as a tie bar to adjacent unit lids 130, 1030 during packaging. The lid 130, 1030 is placed as a single panel unit or strip on the panel assembly after die attach processing and before molding, and the lid 130, 1030 in certain examples includes one or more step or half-etch features to facilitate mold locking and mitigate delamination, as well as to control the gap spacing distance 140. In certain implementations, the lid material thickness over the semiconductor die 102 can be engineered and designed to minimize the gap 141 to enable the least thermal resistance and optimal mold flow during molding. Aluminum lid examples provide comparable thermal performance without TIM to copper with TIM, and thermal performance of the embedded lid 130, 1030 can be further improved by the use of high thermal conductivity mold compound of the package structure 120. In addition, the gap spacing distance 140 between the lid 130, 1030 and the semiconductor die 102 can be designed to facilitate both thermal performance and manufacturability.

Modifications are possible in the described examples, and other implementations are possible, within the scope of the claims.

What is claimed is:

1. An electronic device, comprising:
   a multilevel package substrate having a first level and a second level, the first level having a side with conductive landing areas;
   a die having a first side, a second side, and conductive terminals, the first side of the die facing the multilevel package substrate, and the conductive terminals electrically coupled to respective ones of the conductive landing areas;
   a lid having a first portion, a second portion, and a third portion, the first portion, the second portion, and the third portion forming a continuous conductive structure, the first portion extending in a third plane and having a first side and a second side, the first side of the first portion spaced apart from the second side of the die, the second portion extending between the first portion and the third portion at an acute angle to the third plane and away from the second side of the first portion, and the third portion extending on the side of the first level of the multilevel package substrate in a fourth plane; and a package structure that covering the die, the second portion of the lid, and a portion of the multilevel package substrate, the package structure filling a gap between the first side of the first portion and the second side of the die.

2. The electronic device of claim 1, wherein the package structure exposes a portion of the second side of the first portion of the lid.

3. The electronic device of claim 2, wherein the package structure exposes an end of the third portion of the lid.

4. The electronic device of claim 1, wherein:
the first portion of the lid has a step feature between first and second segments of the second side of the first portion;
the package structure exposes the second side of the first segment of the first portion of the lid; and
the package structure encloses the second segment of the first portion of the lid.

5. The electronic device of claim 4, wherein the first portion of the lid has a second step feature between segments of the first side of the first portion.

6. The electronic device of claim 5, wherein the gap between the first side of the first portion and the second side of the die is 30 μm or more and 100 μm or less.

7. The electronic device of claim 1, wherein the package structure exposes an end of the third portion of the lid.

8. The electronic device of claim 1, wherein the first portion of the lid has a second step feature between segments of the first side of the first portion.

9. The electronic device of claim 1, wherein the gap between the first side of the first portion and the second side of the die is 30 μm or more and 100 μm or less.

10. The electronic device of claim 9, wherein the gap between the first side of the first portion and the second side of the die is 80 μm or less.

11. The electronic device of claim 1, wherein:
the lid has a fourth portion, and a fifth portion;
the first portion, the second portion, the third portion, the fourth portion, and the fifth portion forming the continuous conductive structure;
the fourth portion extends between the first portion and the fifth portion at a second acute angle to the third plane and away from the second side of the first portion;
the fifth portion extends on the side of the first level of the multilevel package substrate in the fourth plane;
the fifth portion is spaced apart from the third portion in the fourth plane; and
the package structure encloses the fourth portion.

12. The electronic device of claim 1, wherein the lid includes aluminum.

13. A lid for use in an electronic device, the lid comprising lid units that form a continuous conductive structure, the respective lid units arranged in an array of rows along a first direction and columns along a second direction that is orthogonal to the first direction;
the respective lid units including a first portion, a second portion, and a third portion, the first portion extending in a first plane of the first and second directions and having opposite first and second sides, the second portion extending between the first portion and the third portion at an acute angle to the first plane and away from the second side of the first portion, and the third portion extending in a second plane of the first and second directions; and
the third portions of adjacent lid units connected to one another, wherein the first portion of the lid has a second step feature between segments of the first side of the first portion.

14. The lid of claim 13, wherein the first portion of the respective lid units has a step feature between segments of the second side of the first portion.

15. The lid of claim 13, wherein the first portion of the lid has a second step feature between segments of the first side of the first portion.

16. The lid of claim 13, wherein the lid includes aluminum.

* * * * *